United States Patent [19]
Giordano et al.

[11] Patent Number: 5,614,852
[45] Date of Patent: Mar. 25, 1997

[54] WIDE COMMON MODE RANGE COMPARATOR AND METHOD

[75] Inventors: Raymond L. Giordano, Flemington; Harold A. Wittlinger, Pennington, both of N.J.

[73] Assignee: Harris Corp., Melbourne, Fla.

[21] Appl. No.: 512,417

[22] Filed: Aug. 8, 1995

[51] Int. Cl.⁶ .............................................. H03K 5/22
[52] U.S. Cl. ........................... 327/63; 327/65; 327/77; 327/89
[58] Field of Search .................... 327/63, 65, 77, 327/69, 70, 89, 560, 561, 562, 563; 330/252, 257

[56] References Cited

U.S. PATENT DOCUMENTS

| | | | |
|---|---|---|---|
| 4,333,058 | 6/1982 | Hoover | 330/257 |
| 5,223,753 | 6/1993 | Lee et al. | 327/63 |
| 5,298,809 | 3/1994 | Yamaguchi | 327/63 |
| 5,319,267 | 6/1994 | Kimura | 330/252 |
| 5,362,995 | 11/1994 | Kubo | 327/65 |
| 5,453,718 | 9/1995 | Kurokawa et al. | 330/252 |

*Primary Examiner*—Toan Tran
*Attorney, Agent, or Firm*—Rogers & Killeen

[57] ABSTRACT

A transconductance amplifier suitable for the input stage of a comparator with the capability of amplifying input signal with common mode voltage components in a range including the entirety of its operating voltage. Operation at one voltage extreme is accomplished by use of a long tailed pair connection of a pair of bulk modulated FETs with gates at the input terminals of the amplifier. Operation at the other voltage extreme is accomplished by the use of a pair of FETs in a source follower mode to drive common gate transistors of opposite polarity, the gates of the FETs also being connected to the input terminals of the amplifier. A common high impedance load for the comparator is connected to current mirrors of the drains of both pairs of FETs in the amplifier. The circuit may be implemented with bipolar transistors and additional amplification provided. Methods of comparing voltages are also disclosed.

33 Claims, 3 Drawing Sheets

WIDE COMMON MODE RANGE COMPARATOR AND METHOD

BACKGROUND OF THE INVENTION

The present invention relates to an integrated circuit voltage comparator and more particularly to a voltage comparator capable of common mode comparisons at both extremes of power supply voltages. The present invention finds particular utility utility where a high level of precision is required.

Circuits for making voltage comparisons are well known. Generally, two independent differential amplifiers or comparator are required—one operational at signal levels near one extreme of the power supply and the other operational at signal levels near the other extreme of the power supply. Each of these two independent comparator feeds a high impedance load from which an output signal can be taken, and the two output signals are combined to provide a single output signal from the comparator circuit. One circuit of this type is disclosed in the Hoover U.S. Pat. No. 4,333,058 dated Jan. 1, 1982.

Known comparators thus require two independent circuits with all of the circuit complexity and expense attendant thereto. In addition, known comparators do not operate in a wide common mode range, i.e., they are not generally functional over the entire voltage range of the power supply. Finally, known comparators lack the precision desired for many applications, particularly where the range of comparison is large.

Accordingly, it is an object of the present invention to provide a novel comparator and method for rail to rail voltage comparison.

It is another object of the present invention to provide a novel comparator and method in which high precision is obtained over substantially the full range of power supply voltage.

It is yet another object of the present invention to provide a novel comparator and method in which the number of circuit elements is significantly reduced by sharing among the positive and negative channels.

It is still another object of the present invention to provide a novel comparator and method in which the positive and negative signal paths share a common current source and load throughout the entire common mode range from the positive to the negative power supply rails.

These and many other objects and advantages of the present invention will be readily apparent to one skilled in the art to which the invention pertains from a perusal of the claims, the appended drawings, and the following detailed description of the preferred embodiments.

DESCRIPTION OP PREFERRED EMBODIMENTS

Figure 1:
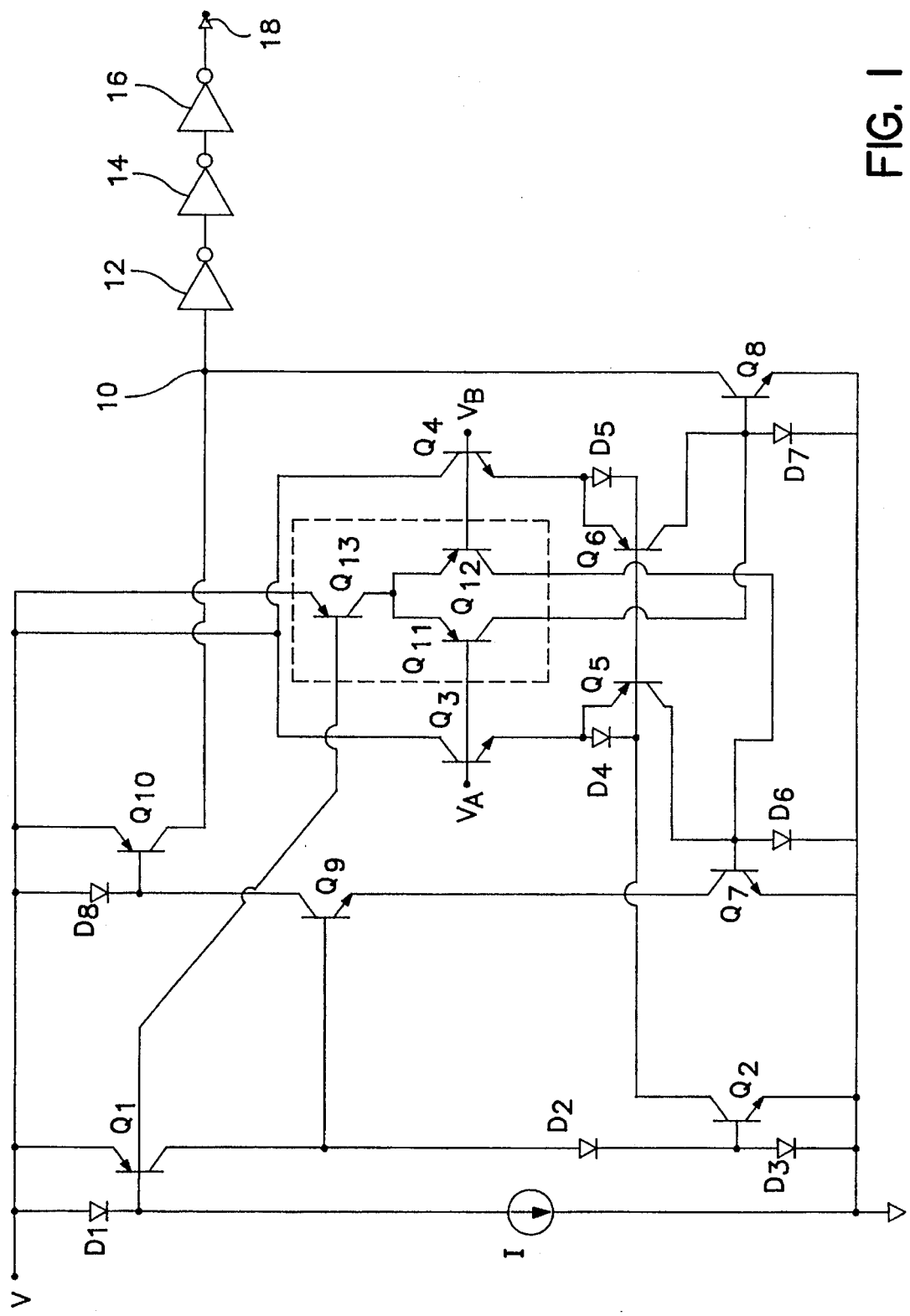
FIG. 1 is a schematic circuit diagram of one embodiment of the comparator of the present invention implemented in bipolar transistors.

With reference to FIG. 1, the comparator of the present invention may be implemented with bipolar junction transistors. Bias current is provided by a suitable conventional current source I connected in series with a diode D1 between a source of voltage, e.g., a positive voltage V and ground potential as shown. The current through the source I passes through the diode D1 and is mirrored through the PNP transistor Q1 and the transistor Q13 as discussed infra. The current through the transistor Q1 passes through the diodes D2 and D3 in series therewith and is mirrored through the NPN transistor Q2.

The current through the transistor Q2 establishes the current through the diodes D4 and D5, which in turn establish the currents through the NPN input transistors Q3 and Q4 which serve as the comparator of the input signals $V_A$ and $V_B$. Where $V_A = V_B$, the current through the transistors Q3 and Q4 will be equal. However, the circuit is very sensitive to voltage differences and any inequality between $V_A$ and $V_B$ will result in the differential conduction of the transistors Q3 and Q4. The transistors Q3 and Q4 serve as emitter followers that permit the bases of the transistors Q5 and Q6 to rise up in common mode to within two diode drops of the voltage V of the power supply.

The current through the transistors Q5 and Q6 are mirrored respectively from the diodes D6 and D7 into the transistors Q7 and Q8. The output current through transistor Q7 is cascoded through the transistor Q9 with the diode D2 providing the required base voltage for the transistor Q9.

The current though the transistor Q9 is mirrored from the diode D8 to the PNP transistor Q10 to provide a source of current which is larger than the sink of current provided by the transistor Q8 when $V_A$ is greater than $V_B$, pulling the node 10 toward the voltage V as one of the binary output signals from the comparator. When $V_B$ is greater than $V_A$, the sink current through the transistor Q8 will be greater than the source current through the transistor Q10 and the node 10 will be pulled toward the lower rail, i.e., ground potential in the circuit illustrated.

The transistors Q3, Q4, Q5 and Q6, and the diodes D6 and D7 allow an input signals $V_A$ and $V_B$ to include the high side of the common mode range supply V. These two signal paths work in concert to amplify differential signals $V_A$ and $V_B$.

This output signal on node 10 may be buffered, for example by the three series connected inverters 12, 14 and 16 to provide a buffered binary output signal for the comparator on the terminal 18.

The circuit of FIG. 1 as thus far described illustrates the operation of part of the comparator dealing with input voltages $V_A$ and $V_B$ which move toward the most positive supply V. When the voltages $V_A$ and $V_B$ move toward the most negative power supply or ground, additional circuit components are required. For input voltages excursions within approximately one $V_{BE}$ or one $V_{GS}$ from the supply voltage, only one of the circuits will be functional. However, both circuits are functional for all input voltage excursions from the supply voltage which exceed such level.

With continued reference to FIG. 1, a second pair of input transistors, i.e. PNP transistors Q11 and Q12, are provided. These transistors also receive the input voltages $V_A$ and $V_B$ as shown and provide a parallel path from the voltage V to ground potential, i.e., greater current through the transistors Q13 and Q12 and diode D6 where $V_B$ is less than $V_A$, and through the transistors Q13 and Q11 and diode D7 where $V_A$ is less than $V_B$.

The transistors Q11 and Q12 allow signals $V_A$ and $V_B$ to include signals within one $V_{BE}$ of ground.

Again depending on the current through the diodes D6 and D7, either the transistor Q10 or the transistor Q8 will conduct to establish the binary output signal on the node 10. This output signal on node 10 may be buffered, for example by the three series connected inverters 12, 14 and 16 to provide a buffered output signal for the comparator on the terminal 18.

Note that the amplification of the current through the diodes D6 and D7 can be accomplished by the current ratio between the diode D6 and the transistor Q7 or between the diode D8 and the transistor Q10 on the current source side, and by the current ratio between the diode D7 and the transistor Q8 on the current sink side.

Figure 2:
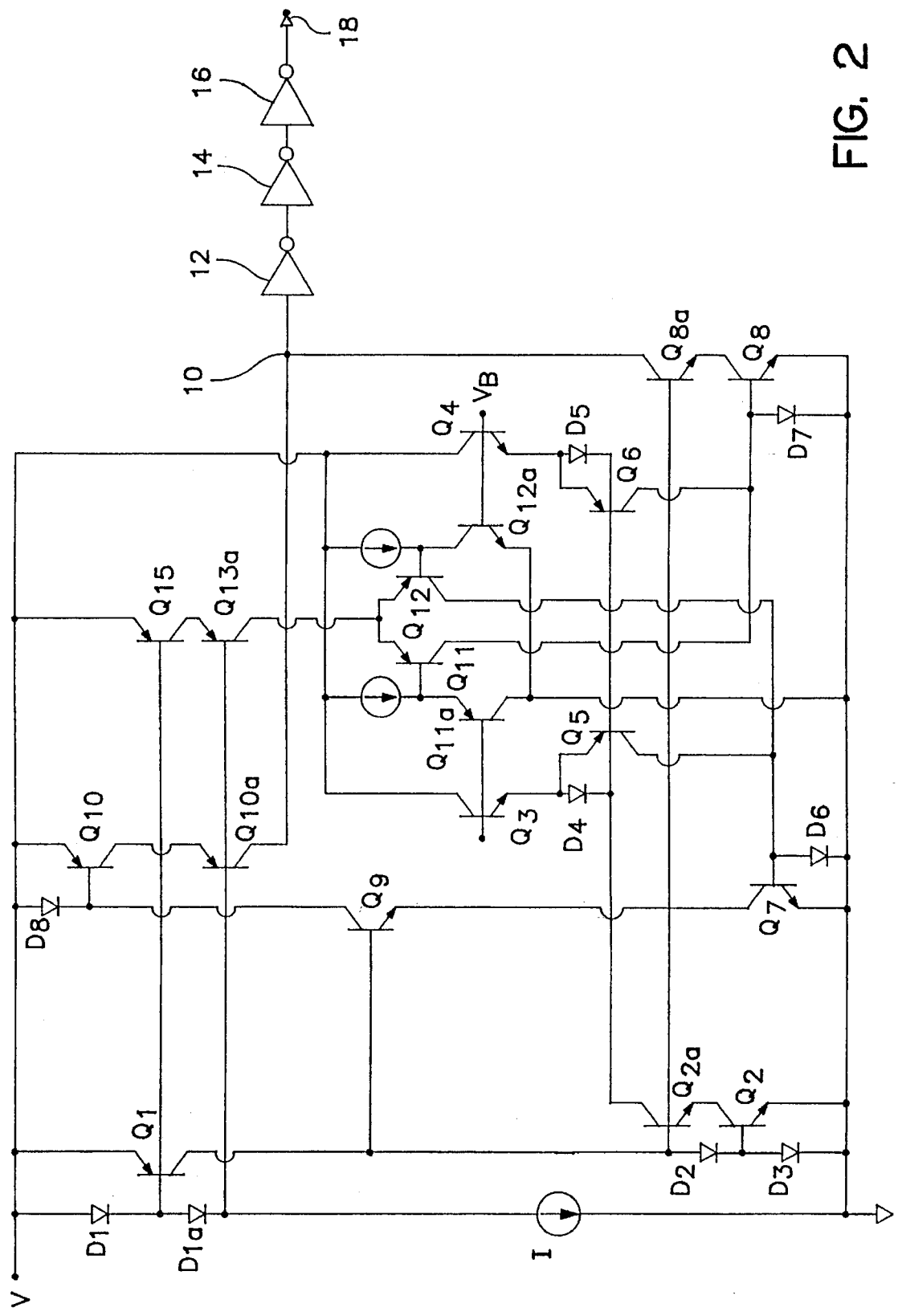
FIG. 2 is a schematic circuit diagram of a second embodiment of the comparator of the present invention implemented with bipolar transistors with cascoding at all critical stages.

For an enhanced performance comparator, reference may be had to FIG. 2 where circuit elements common to FIG. 1 have been given like numerical designations to facilitate an understanding thereof. As shown in FIG. 2, the diodes D1–D8 and the transistors Q1–Q13 remain the same with all critical stages within the comparator cascoded to enhance the performance of the comparator with respect to gain and signal rejection.

With reference to FIG. 2, a second diode D1a is provided in series with the current source I and provides bias to the base of a PNP transistor Q13a. Similarly, the anode of the diode D2 is connected to the base of the additional NPN transistors Q2a and Q8a. Cascoding of the transistors increases the output resistance. Since gain is a direct function of the output resistance, the gain of the comparator will be higher. Also transistors Q11a and Q12a may be added to allow operation with common mode signals including the lower rail voltage, i.e., ground in the circuit illustrated.

Figure 3:
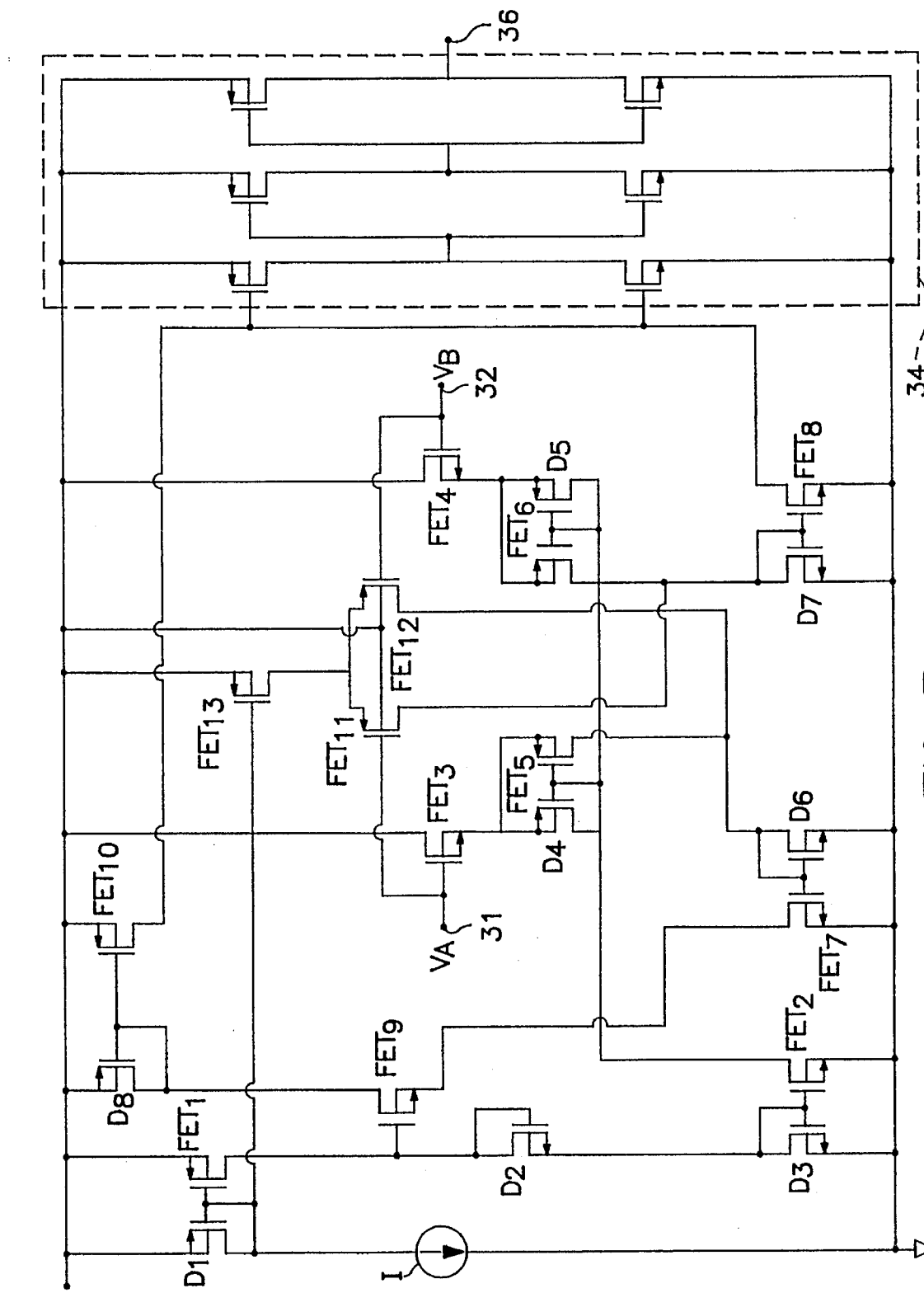
FIG. 3 is a schematic circuit diagram of a third embodiment of the comparator of the present invention implemented in MOS transistors.

However, the comparator of the present invention is desirably implemented with MOS devices. As shown in FIG. 3, bias current is provided by the current source I and the current through D1 is mirrored through FET 1 to control the current through FET 2 and FET 13, and thus through FET 3, FET 4, FET 11 and FET 12 which respond to input voltages $V_A$ and $V_B$.

The operation of the circuit of FIG. 3 is similar to that of the circuit of FIG. 1, except that the bulk modulation of FET 11 and FET 12 makes the common mode range of the circuit include the voltage of the lower rail.

In fact, the circuit of the present invention may compare voltages a few hundred millivolts outside the rail voltages.

As is well known, equal currents through the transistors requires that the FETs must be of the same size and the areas of the emitters must be of the same physical size. Where desired, the size of the transistors may be scaled.

ADVANTAGES AND SCOPE OF THE INVENTION

The comparator of the present invention is capable of rail to rail voltage comparisons and common mode operation, i.e., over the entire range of the power supply.

In addition, the comparator of the present invention is very precise. The transfer characteristic has been simulated with power supply voltage 5.0 volts to ground and with input voltages varying from 4.95 volts to 0.05 volts. Maximum error at common mode operation varies from approximately 0.009 volts at 4.95 volts to 0.0005 volts at 0.05 volts. Note in this regard for example, that a five volt range of the power supply may be centered about any voltage, e.g., the voltage may range from −3.0 to −8.0 volts, or +2.5 to −2.5 volts as desired.

By sharing the current source and a load, the comparator of the present invention is simple in construction and easily implemented as an integrated circuit.

While preferred embodiments of the present invention have been described, it is to be understood that the embodiments described are illustrative only and the scope of the invention is to be defined solely by the appended claims when accorded a full range of equivalence, with many variations and modifications naturally occurring to those of skill in this art from the foregoing.

What is claimed is:

1. The method of comparing two voltages comprising the steps of:
   (a) applying a first input voltage to be compared to a first complementary pairs of transistors,
   (b) applying a second input voltage to be compared to a second complementary pairs of transistors,
   (c) applying current from one of each of the two pairs of transistors to a first diode load;
   (d) applying current from the other one of each of the two pairs of transistors to a second diode load; and
   (e) mirroring the current through each of the two diode loads to an output transistor coupled between an output terminal and a source of voltage,
   so that the voltage of the output terminal identifies the one of the two input voltages which is greater.

2. The method of claim 1 where the transistors are MOS devices.

3. The method of claim 1 where the transistors are BJTs.

4. The method of claim 1 where the pairs of transistors are operably connected across a voltage and are responsive to the entire voltage range thereof.

5. The method of claim 1 wherein the comparator is an integrated circuit.

6. The method of claim 1 wherein the transistors are discrete circuit components.

7. An integrated circuit transconductance comparator with wide common mode range comprising:
   a pair of input terminals adapted to receive two voltages to be compared;
   a first pair of transistors connected one each to one of said input terminals and being conductive in response to the difference in the voltages applied to said input terminals;
   a second pair of transistors connected one each to one of said input terminals and being conductive in response to the difference in the voltages applied to said input terminals;
   a first current source operatively connected to said first pair of transistors;
   a second current source operatively connected to said second pair of transistors;
   a first diode load operatively connected to one of the transistors in each of said first and second pair of transistors;
   a second diode load operatively connected to the other one of the transistors in each of said first and second pair of transistors;
   a series circuit comprising first and second output transistors with an output terminal at the interconnection thereof;
   means for applying a voltage across said series circuit;

means for mirroring the current through said first diode load into said first output transistor; and means for mirroring the current through said second diode load into said second output transistor, so that the one of said first and second output transistors with the greatest current will identify the one of said pair of input terminals to which has been applied the highest voltage.

8. The comparator of claim 7 including a plural stage buffer connected to said output terminal.

9. The comparator of claim 7 wherein each of said transistors are MOS devices.

10. The comparator of claim 7 wherein each of said transistors are BJTs.

11. The comparator of claim 7 wherein said first and second output transistors are complementary.

12. The comparator of claim 7 wherein said the transistors of said first pair of transistors are complementary to those of said second pair of transistors.

13. The comparator of claim 7 wherein the current through said first diode load is reflected to the highest side of said voltage means.

14. The comparator of claim 7 wherein said comparator is functional over the entire common mode range of said voltage means.

15. The comparator of claim 14 wherein said comparator is functional over a range greater than the common mode range of said voltage means.

16. A comparator circuit comprising:

first and second input transistors;

third and fourth input transistors complementary to said first and second transistors, said first through fourth input transistors for being controlled by input voltages which are to be compared;

a fifth transistor operatively connected to said third and fourth transistors;

sixth and seventh transistors operatively connected to said first and second transistors;

a diode load for said first and fourth transistors; and a diode load for said second and third transistors.

17. The circuit of claim 16 including:

means for mirroring a first current into said first and second transistors; and means for mirroring a second current into said third and fourth transistors.

18. The circuit of claim 17 wherein said first current equals said second current.

19. The circuit of claim 16 including means for mirroring current flowing through said diode loads into a common load.

20. The circuit of claim 16 wherein said transistors are field effect devices.

21. The circuit of claim 16 wherein said transistors are bipolar devices.

22. The method of claim 4 wherein the comparator is an integrated circuit.

23. The comparator of claim 13 wherein said first and second output transistors are complementary.

24. The comparator of claim 11 wherein said transistors of said first pair of transistors are complementary to those of said second pair of transistors.

25. The comparator of claim 24 wherein each of said transistors is a MOS device.

26. The circuit of claim 19 including:

means for mirroring a first current into said first and second transistors; and means for mirroring a second current into said third and fourth transistors.

27. The circuit of claim 26 wherein said transistors are field effect devices.

28. A method of comparing two input voltages comprising the steps of:

(a) applying current from a first source into each of two diode loads responsively to the difference between the two input voltages;

(b) applying current from a second source into each of the two diode loads responsively to the difference between the two input voltages; and (c) mirroring the current through the diode loads into a single output terminal.

29. The method of claim 28 wherein the difference between the two input voltages results from an application of each of the input voltages to complementary transistors.

30. The method of claim 28 wherein a common mode range of the complementary transistors includes the entire range of a supply voltage.

31. Apparatus for comparing two input voltages comprising:

(a) means for applying current from a first source into each of two diode loads responsively to a comparison between the two input voltages;

(b) means for applying current from a second source into each of said two diode loads responsively to a comparison between the two input voltages; and (c) means for mirroring the current through said diode loads into a single output terminal.

32. The apparatus of claim 31 wherein both of said comparisons between the two input voltages are accomplished in a comparator means having complementary transistors.

33. The apparatus of claim 32 wherein a common mode range of said comparator means includes the entire range of a supply voltage.

* * * * *